(12) United States Patent
Yin et al.

(10) Patent No.: US 8,064,202 B2
(45) Date of Patent: Nov. 22, 2011

(54) SANDWICH STRUCTURE WITH DOUBLE-SIDED COOLING AND EMI SHIELDING

(75) Inventors: Jian Yin, San Jose, CA (US); Hunt H. Jiang, San Jose, CA (US); Kaiwei Yao, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 12/712,058

(22) Filed: Feb. 24, 2010

(65) Prior Publication Data

US 2011/0205709 A1 Aug. 25, 2011

(51) Int. Cl.
*H05K 7/20* (2006.01)
(52) U.S. Cl. .............. 361/704; 361/679.46; 361/679.54; 361/715; 361/719; 165/80.3; 165/185; 174/15.1; 174/16.3; 174/252; 257/686; 257/706; 257/707
(58) Field of Classification Search ............ 361/679.46, 361/679.54, 704, 715, 719, 717–724, 756, 361/762, 772; 257/706, 707, 718, 719, 773, 257/777, 690; 165/80.3, 204.33, 185; 174/15.1, 174/16.3, 252
See application file for complete search history.

(56) References Cited

U.S. PATENT DOCUMENTS

| | | | | |
|---|---|---|---|---|
| 5,886,408 A * | 3/1999 | Ohki et al. | ..................... | 257/720 |
| 6,304,450 B1 * | 10/2001 | Dibene et al. | .................. | 361/704 |
| 6,442,026 B2 * | 8/2002 | Yamaoka | ...................... | 361/704 |
| 6,724,631 B2 * | 4/2004 | Ye et al. | ......................... | 361/719 |
| 7,129,577 B2 * | 10/2006 | Maxwell | ........................ | 257/707 |
| 7,345,885 B2 * | 3/2008 | Boudreaux et al. | ........... | 361/721 |
| 7,646,093 B2 * | 1/2010 | Braunisch et al. | ............ | 257/718 |
| 7,847,413 B2 * | 12/2010 | Akiba et al. | ................... | 257/777 |
| 7,880,282 B2 * | 2/2011 | Holland | ......................... | 257/678 |
| 2005/0224955 A1 * | 10/2005 | Desai et al. | ................... | 257/706 |
| 2008/0054439 A1 * | 3/2008 | Malhan et al. | ................ | 257/690 |
| 2010/0027228 A1 * | 2/2010 | Tsukada et al. | ............... | 361/772 |
| 2010/0127400 A1 * | 5/2010 | Kanschat et al. | ............. | 257/773 |

* cited by examiner

*Primary Examiner* — Michail V Datskovskiy
(74) *Attorney, Agent, or Firm* — Perkins Coie LLP

(57) ABSTRACT

A sandwich structure and method thereof is disclosed for double-sided cooling, EMI noise shielding and current carrying in mini-modules. The proposed structure comprises a top structure and a bottom structure to achieve double-sided cooling. Meanwhile, the top structure is configured to shield EMI noises as well. The proposed structure further comprises a first set of connecting structures for connecting devices of the mini-modules with the top structure and a second set of connecting structure for connecting the top structure with the bottom structure. The connecting structures are capable of carrying current.

15 Claims, 6 Drawing Sheets

SANDWICH STRUCTURE WITH DOUBLE-SIDED COOLING AND EMI SHIELDING

FIELD OF THE INVENTION

A sandwich structure for electronic circuitry is disclosed, and more particularly, a sandwich structure used in mini-modules for thermal cooling and EMI shielding.

BACKGROUND

A mini-module is a module with small size and low output power. Currently, wire bonding technology is widely used in mini-module packages. One drawback is that due to the relatively long wire connection, the wire resistance is large, causing power loss and low efficiency. This limits the ability to carry high current. Additionally, the bonding wire is thin, and this produces a parasitic inductance, which can cause a resonant ringing during switching. The resonant ringing causes an additional loss in the circuit and generates electromagnetic interference (EMI) noise. Furthermore, wire bonding technology can only dissipate the heat produced by the mini-module from the bottom side, so its cooling capability is limited. As the load current becomes higher, wire bonding technology is not optimum because of power loss and limited heat dissipation ability.

To reduce the EMI noise, most prior-art methods focus on improving the underlying electrical circuitry, which generally makes the circuitry more complicated and increases cost. Further, these prior-art methods often sacrifice the efficiency of the circuitry.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
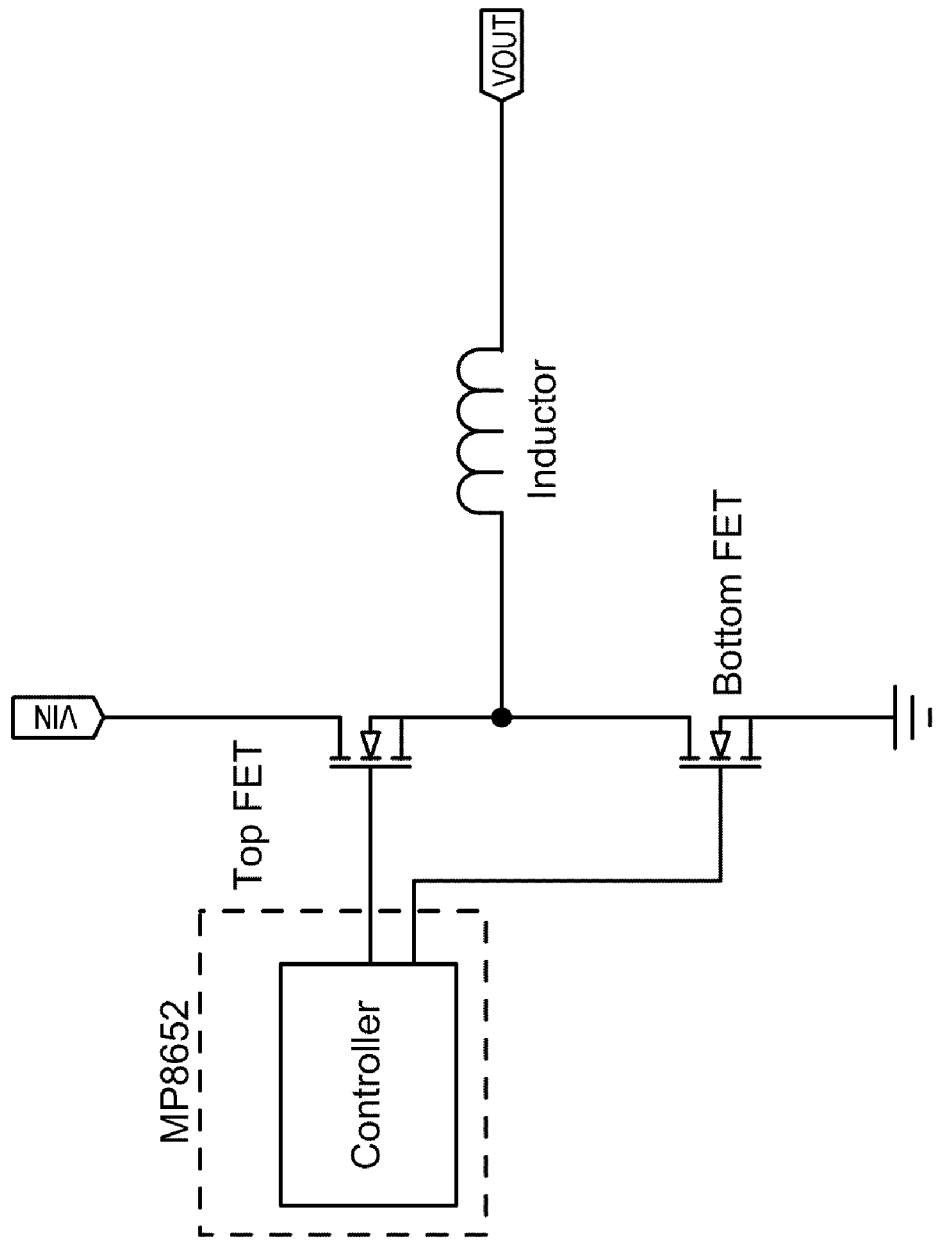
FIG. 1 shows a circuit illustrating a DC-DC buck converter.

FIG. 1 shows a basic DC-DC buck converter circuit. On this circuit, a controller is used to operate the circuit. In one embodiment, the controller is manufactured and sold by the assignee of the present application, Monolithic Power Systems of Los Gatos, California, designated as part number MP8652. The circuit comprises the MP8652 controller having a built in internal top FET, a bottom FET, and an inductor. It can be appreciated that the MP8652 is used merely as an example and any other controller can be used as well.

Figure 2A:
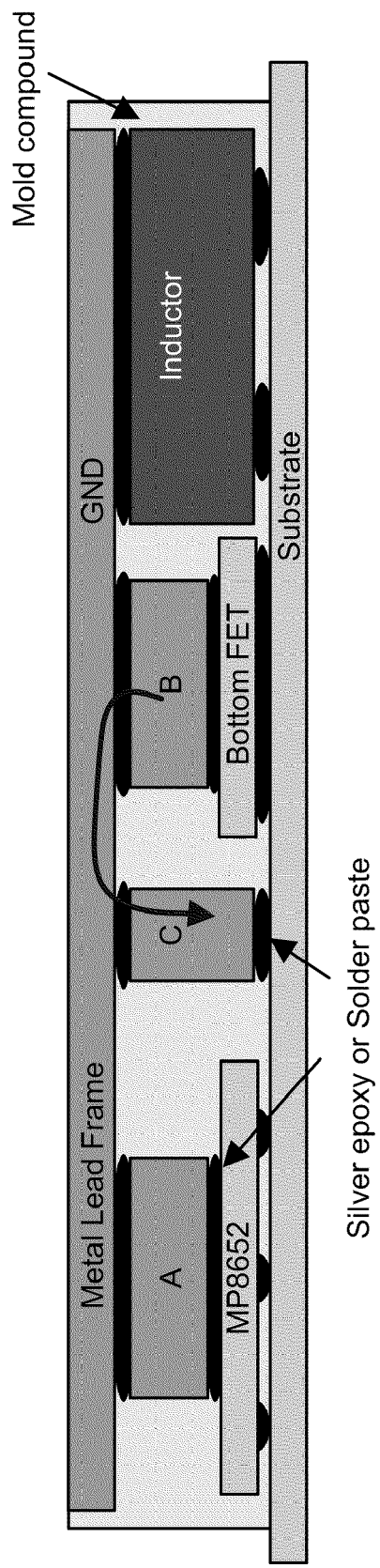
FIG. 2A shows a sectional view of a structure illustrating the circuit in FIG. 1 according to a first embodiment of the present invention.

The schematic circuit shown in FIG. 1 is implemented in a novel sandwich structure shown in FIG. 2A according to a first embodiment of the present invention. As shown in FIG. 2A, the controller is mounted on a substrate using flip-chip technology. The controller is "flipped over" so that its topside is ground and its bottom side is attached to the substrate using conventional solder paste. The bottom FET and the inductor are mounted on the substrate using solder paste through a conventional regular reflow process.

A first metal pin A and a second metal pin B are respectively used to connect the MP8652 and the bottom FET with a top metal lead frame which covers the entire mini-module area through either silver epoxy paste or solder paste. The first metal pin A and the second metal pin B help to cool down the MP8652 and the bottom FET. The substrate can be a printed circuit board (PCB) with different types of core materials or a metal film. Both the metal lead frame and the substrate will carry current and route control signals. A third metal pin C is connected between the metal lead frame and the substrate directly for connecting the power GND of the lead frame to the GND on the substrate. The metal pin C replaces the traditional wire bonding connection to provide a current path from the bottom FET to the substrate to carry current. In an alternative embodiment, the third metal pin C can be also used to transfer the signals or carry currents between the top lead frame layer and the substrate layer.

Figure 2B:
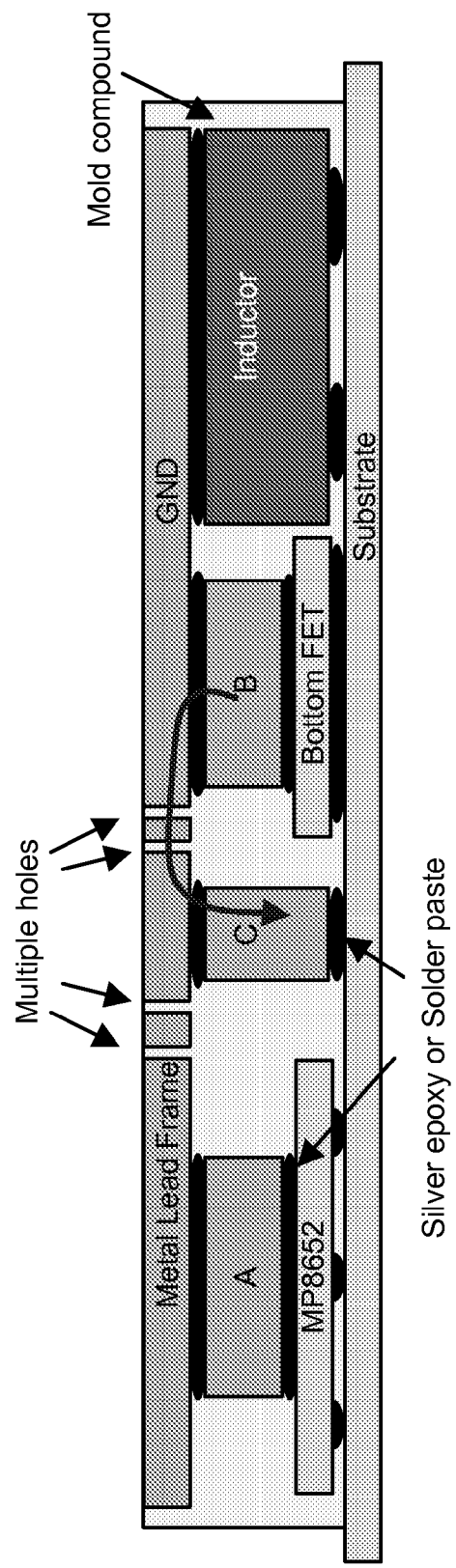
FIG. 2B illustrates the multiple holes made through the top lead frame.
Figure 2C:
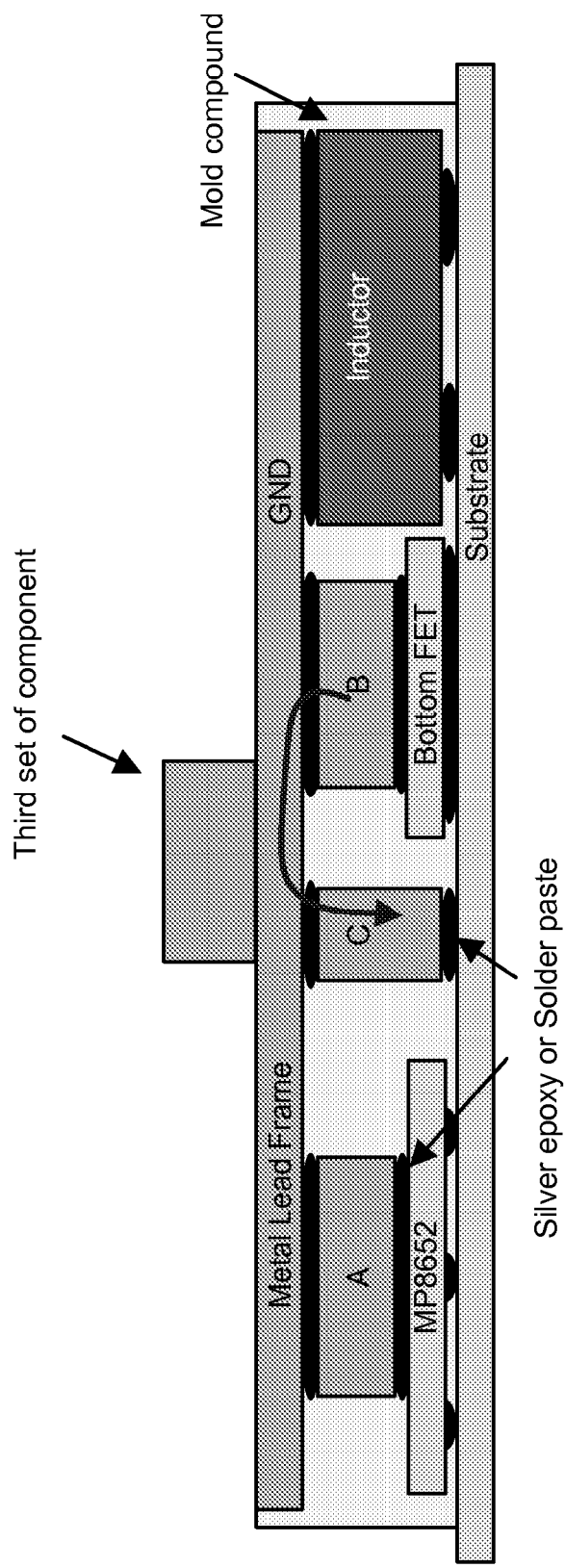
FIG. 2C illustrates the third set of one or more components mounted on the top surface of the to lead frame.

In one embodiment shown in FIG. 2B, multiple holes are formed through the metal lead frame. The holes made through the metal lead frame are used to allow injection of a mold compound material into the mini-module and to form a solid package. Additionally, the holes can reduce eddy current and thus improve the shielding effect more efficiently. The mold compound material is filled into the whole mini-module for electrical insulation. The mold compound material can be silicon. In one embodiment shown in FIG. 2C, the sandwich structure further comprises a third set of one or more components mounted on said top surface of said top lead frame.

The inductor is attached to the metal lead frame through silver epoxy paste, which helps the inductor to cool down and thus improve the efficiency.

Figure 3:
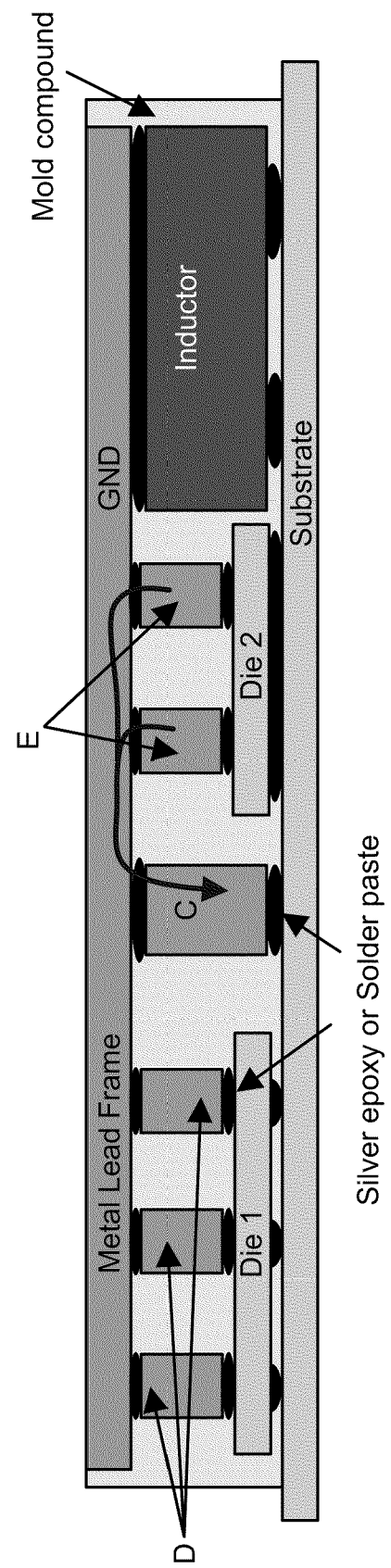
FIG. 3 shows a sectional view of a structure according to a second embodiment of the present invention.

FIG. 3 shows an improved sandwich structure according to a second embodiment of the present invention. As shown, compared to the structure shown in FIG. 2A, the internal components die 1 and die 2 are connected to a metal lead frame respectively through a first set of small metal pins D and a second set of small metal pins E. Such connections using multiple smaller pins can avoid too much thermally-induced stress between the use of single metal pins and the dies and avoid dies cracking.

Figure 4:
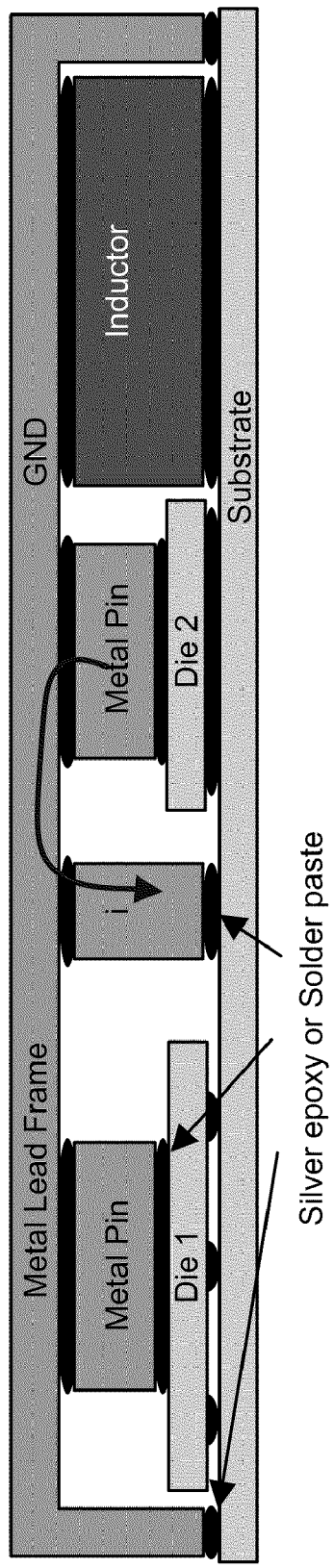
FIG. 4 shows a sectional view of a structure according to a third embodiment of the present invention.

FIG. 4 shows an improved sandwich structure according to a third embodiment of the present invention. As shown, compared to the structure shown in FIG. 2A, the metal lead frame is fabricated as a sealed cap with an open bottom side. The sealed cap is attached to the substrate using silver epoxy paste or solder paste and covers the mini-module fully. Such a structure saves cost by eliminating the need to use the mold compound material. Additionally, the fully sealed cap blocks EMI noise leakage from the sides of the mini-module, thus improving the EMI shielding effect. Moreover, the structure shown in FIG. 4 provides an additional thermal path to dissipate heat and improves the thermal performance with the direct connection from the metal lead frame to the substrate.

The invention claimed is:

1. A sandwich structure for mini-modules, comprising:
   a top lead frame for thermal cooling, EMI shielding and current carrying, wherein said top lead frame has a top surface and a bottom surface;
   a bottom structure for thermal cooling, current carrying and circuit controlling, wherein said bottom structure has a top surface and a bottom surface;
   internal components, wherein said internal components comprise at least a first set of one or more components, further wherein a first side of each of said first set of one or more components is mounted on said top surface of said bottom structure;
   a first set of one or more connecting structures, each of said first set of one or more connecting structures for connecting each of said first set of one or more components with said bottom surface of said top lead frame; and
   a second set of one or more connecting structures connected between said bottom surface of said top lead frame and said top surface of said bottom structure for providing one or more current paths for said internal components.

2. The sandwich structure as claimed in claim 1, wherein each of said first set of one or more connecting structures comprises one or more metal pins.

3. The sandwich structure as claimed in claim 1, wherein each of said second set of one or more connecting structures comprises one or more metal pins.

4. The sandwich structure as claimed in claim 1, wherein said bottom structure is a substrate or a metal lead frame.

5. The sandwich structure as claimed in claim 1, wherein said first and second sets of one or more connecting structures are connected to said bottom surface of said top lead frame using a conductive paste, each of said first set of one or more connecting structures is connected to a second side of each of said first set of one or more components using a conductive paste, and said second set of one or more connecting structures are connected to said top surface of said bottom structure using a conductive paste.

6. The sandwich structure as claimed in claim 1, wherein said top lead frame is a plate or a sealed cap covering said mini-modules fully, further wherein the air gap of said mini-modules is filled with an insulating material when said top lead frame is a plate.

7. The sandwich structure as claimed in claim 1, wherein a set of holes are made through the top lead frame.

8. The sandwich structure as claimed in claim 1, wherein said internal components further comprise a second set of one or more components connected to said bottom surface of said top lead frame or said top surface of said bottom structure using a conductive paste.

9. The sandwich structure as claimed in claim 8, a first side of each of said second set of one or more components is mounted on said top surface of said bottom structure and a second side of each of said second set of one or more components is connected with said top lead frame using a conductive paste.

10. The sandwich structure as claimed in claim 1, wherein said sandwich structure further comprise a third set of one or more components mounted on said top surface of said top lead frame.

11. A method for cooling mini-modules, shielding EMI noises of said mini-modules and carrying currents, comprising:
    mounting a first set of one or more components on a top surface of a bottom structure, wherein said bottom structure is configured for thermal cooling, current carrying and circuit controlling;
    connecting a first side of each of a first set of one or more connecting structures with a top lead frame, wherein said top lead frame is configured for thermal cooling, EMI shielding and current carrying;
    connecting a first side of each of a second set of one or more connecting structures with a bottom surface of said top lead frame, wherein said second set of one or more connecting structures are configured to provide one or more current paths for said mini-modules;
    connecting a second side of each of a first set of one or more connecting structures with each of said first set of one or more components; and
    connecting a second side of each of said second set of one or more connecting structures with said top surface of said bottom structure.

12. The method as claimed in claim 11, further comprising the step of connecting a first side of each of a second set of one or more components with said top surface of said bottom structure or a second side of each of said second set of one or more components with said bottom surface of said top lead frame.

13. The method as claimed in claim 11, further comprising the step of mounting a third set of one or more components on a top surface of said top lead frame.

14. The method as claimed in claim 11, further comprise the step of making a set of holes through said top lead frame.

15. The method as claimed in claim 11, wherein said top lead frame is a plate or a sealed cap fully covering said mini-modules; further wherein said method comprises the step of filling the air gap of said mini-modules with an insulating material when said top lead frame is a plate.

* * * * *

UNITED STATES PATENT AND TRADEMARK OFFICE
CERTIFICATE OF CORRECTION

| | | |
|---|---|---|
| PATENT NO. | : 8,064,202 B2 | Page 1 of 1 |
| APPLICATION NO. | : 12/712058 | |
| DATED | : November 22, 2011 | |
| INVENTOR(S) | : Yin et al. | |

It is certified that error appears in the above-identified patent and that said Letters Patent is hereby corrected as shown below:

In column 1, line 45, delete "to" and insert -- top --, therefor.

Signed and Sealed this
Twenty-seventh Day of March, 2012

David J. Kappos
*Director of the United States Patent and Trademark Office*